United States Patent
O'Neill et al.

(10) Patent No.: US 7,807,951 B1
(45) Date of Patent: Oct. 5, 2010

(54) IMAGING SENSOR SYSTEM WITH STAGGERED ARRANGEMENT OF IMAGING DETECTOR SUBELEMENTS, AND METHOD FOR LOCATING A POSITION OF A FEATURE IN A SCENE

(75) Inventors: Mary Morabito O'Neill, Santa Barbara, CA (US); Gregory K. Pierce, Santa Barbara, CA (US); William H. Wellman, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 945 days.

(21) Appl. No.: 10/790,889

(22) Filed: Mar. 1, 2004

(51) Int. Cl.
*H01L 27/00* (2006.01)

(52) U.S. Cl. ............ 250/208.1; 348/315; 348/340

(58) Field of Classification Search ........ 250/208.1; 348/275, 315, 342
See application file for complete search history.

(56) References Cited

U.S. PATENT DOCUMENTS

| | | | | |
|---|---|---|---|---|
| 4,441,123 A * | 4/1984 | Ochi | | 348/275 |
| 4,796,187 A | 1/1989 | North | | 364/423 |
| 4,868,871 A | 9/1989 | Watson, III | | 382/1 |
| 4,910,401 A | 3/1990 | Woods | | 250/332 |
| 5,023,921 A | 6/1991 | Goutte et al. | | 382/58 |
| 5,065,245 A * | 11/1991 | Carnall et al. | | 348/373 |
| 5,075,553 A | 12/1991 | Noble et al. | | 250/352 |
| 5,438,366 A * | 8/1995 | Jackson et al. | | 348/342 |
| 5,878,163 A | 3/1999 | Stephan et al. | | 382/172 |
| 6,596,979 B2 * | 7/2003 | Hou | | 250/208.1 |
| 6,654,056 B1 * | 11/2003 | Perregaux et al. | | 348/275 |
| 2003/0053221 A1 * | 3/2003 | Coufal et al. | | 359/708 |
| 2003/0155518 A1 * | 8/2003 | Francke | | 250/385.1 |
| 2004/0031904 A1 * | 2/2004 | Chen | | 250/208.1 |

* cited by examiner

*Primary Examiner*—Georgia Y Epps
*Assistant Examiner*—Kevin Wyatt (57) ABSTRACT

An imaging sensor system includes an optics system that images a point feature of a scene at an image plane with a blur-circle image having a blur diameter, and a detector array at the image plane. Special array patterns and signal detector logic are used to improve the accuracy of the determination of the object location. In one form, the detector array is a one-dimensional detector array comprising a plurality of detector subelements each having a width of from about ½ to about 5 blur diameters, and a length of n blur diameters. Each detector subelement overlaps each of two adjacent detector subelements along their lengths. An overlap of each of the two adjacent detector subelements is m blur diameters, and a center-to-center spacing of each of the two adjacent detector subelements is $n_O$ blur diameters. The value of n is equal to about 3m, and the value of m is equal to about $n_O/2$. In another form, the detector is a two-dimensional detector array of detector subelements. The detector subelements are sized and staggered such that an area of the blur-circle image may not simultaneously be split equally among four detector subelements.

14 Claims, 6 Drawing Sheets

IMAGING SENSOR SYSTEM WITH STAGGERED ARRANGEMENT OF IMAGING DETECTOR SUBELEMENTS, AND METHOD FOR LOCATING A POSITION OF A FEATURE IN A SCENE

This invention relates to an imaging sensor system that employs a segmented detector array and, more particularly, to an approach for improving the accuracy of the determination of the image location on the segmented detector array by overlapping the detector subelements.

BACKGROUND OF THE INVENTION

In a typical light-imaging sensor system, a feature in a scene is imaged onto an image surface by optical elements such as lenses and mirrors. A detector segmented array formed of a number of detector subelements is located at the image surface, so that the feature is imaged onto the detector array. The output signals of the detector subelements are amplified and supplied to an image-processing computer, which determines the location and nature of the image of the feature.

The detector array may be a one-dimensional or linear array of detector subelements that is optionally scanned over the scene to produce a two-dimensional image. The detector array may instead be a two-dimensional areal or staring array of detector subelements. The one-dimensional array has the advantage of a smaller number of detector subelements and processing channels, and consequently a lower cost, as compared with the two-dimensional staring array. It also has a cost advantage for multispectral sensing, in which parallel arrays of ordinary detectors are used with spectral filters or spectral dispersive elements, whereas staring detectors require extraordinary construction for just two-color or three-color sensing. On the other hand, the one-dimensional array requires a scanning mechanism for many applications, although in other applications the scanning movement may be produced by the motion of the platform that carries the imaging sensor system.

The accuracy of the determination of the location of the feature is a crucial concern in such imaging sensors. The spatial location of the image on the detector array may be translated geometrically into an angle of the feature relative to a reference axis of the sensor, such as the boresight of the platform that carries the sensor.

In the usual approach, the spatial location of the feature is determined by observing which detector subelement intercepts the image of the feature. However, in both the one-dimensional and two-dimensional detector arrays, there is a natural locational uncertainty of the image within the detector subelement. If the detector subelements are made smaller to reduce this uncertainly, "edge effects" between adjacent detector subelements introduce a locational uncertainty, as the image of the feature may not fall entirely within a single detector subelement, as well as a loss of sensitivity because the signal energy of the feature is split between two or more detector subelements. The accuracy of the location determination is thus limited by the geometry and absolute size of the detector subelements.

There is a need for an improved approach for the structure of the detector array and the analysis of the output signals of the detectors to achieve increased accuracy in the determination of the location of the image of the feature. The present invention fulfills this need, and further provides related advantages.

SUMMARY OF THE INVENTION

The present invention provides a structure of the detector array that results in increased positional accuracy of the determination of the image location, and a method for signal analysis that improves the locating of the position of the feature in the scene. The accuracy of the determined location is increased by as much as a factor of two. The sensitivity of the detector array is not compromised and may in fact be improved. The present approach is compatible with other known sensor technologies such as the use of filters placed between the scene and the detector array, so that a range of spectral bands may be viewed. No changes to the optics system are required to achieve the improved accuracy determination. There is little cost increase associated with the present approach.

In accordance with the invention, an imaging sensor system comprises an optics system that images a point feature of a scene at an image plane as a blur-circle image having a blur diameter, and a detector array at the image plane. The detector array is a one-dimensional (sometimes termed "linear") detector array comprising a plurality of detector subelements each having a width of from about ½ to about 5 blur diameters, most preferably about 1 blur diameter, and a length of n blur diameters. The value of n is preferably greater than 1 and most preferably much greater than 1, typically 20 or more. The detector subelements are preferably rectangular in shape. Each detector subelement overlaps each of two adjacent detector subelements along their lengths. An overlap of each of the two adjacent detector subelements is m blur diameters and a center-to-center spacing of each of the two adjacent detector subelements is $n_O$ blur diameters. The value of n is equal to about 3m, and the value of m is equal to about $n_O/2$.

Preferably, n lies in a range of from about $(3m-2)$ to about $(3m+2)$, and m lies in a range of from about $(n_O/2-1)$ to about $(n_O/2+1)$. More preferably, n lies in a range from $(3m-2)$ to $(3m+2)$, and m lies in a range of from $(n_O/2-1)$ to $(n_O/2+1)$. Most preferably, n is equal to 3m, and m is equal to $n_O/2$.

Where the length of the detector subelements is at least 20 times the detector width, n may be substantially equal to 3m and m may be substantially equal to $n_O/2$. In other cases, particularly where the signal levels are weak and the length of the detector subelements is less than 20 times the detector width, n is preferably substantially equal to $(3m-2)$ and m is substantially equal to $(n_O/2-1)$. In yet other cases, particularly when the signal levels are strong and the length of the detector subelements is less than 20 times the detector width, n is substantially equal to $(3m+2)$ and m is substantially equal to $(n_O/2+1)$.

The one-dimensional detector array achieves two-dimensional imaging by scanning the one-dimensional detector array in a direction perpendicular to the lengthwise direction of the one-dimensional detector array. The scanning may be accomplished using a scanning mechanism that scans the one-dimensional detector array in a direction perpendicular to the length of the detector subelements, or by mounting the optics system and the one-dimensional detector array on a moving platform whose motion produces the scanning effect.

By overlapping the detector subelements in the optimum manner, the accuracy of the determination of the position of the image of the feature in the scene may be improved significantly, by as much as a factor of 2. This allows the feature to be tracked more precisely and analyzed more precisely to ascertain its nature.

The present concepts may be further applied to improve the sensitivity of two-dimensional staring detector arrays. An imaging sensor system comprises an optics system that images a point feature of a scene at an image plane as a blur-circle image having a blur-circle diameter, and a detector array at the image plane. The detector array is a two-dimensional detector array comprising a plurality of detector subelements, and the detector subelements are sized and staggered such that an area of the blur-circle image may not simultaneously be split equally among four detector subelements. In one embodiment, the detector subelements are square in plan view. In another embodiment, the detector subelements are rectangular in plan view. Optimally, each detector subelement is rectangular in plan view with a length of m blur diameters, a lengthwise overlap of 1 blur diameter relative to a laterally adjacent detector subelement, and a staggered pattern of detector subelements that repeats every m laterally adjacent rows, where m is a positive integer.

A method for locating a position of a feature in a scene comprises the steps of forming an image of the feature using a segmented array having a plurality of array subelements, wherein each of the array subelements has an output signal. The method further includes cooperatively analyzing the output signals from at least two spatially adjacent array subelements to establish a data set reflective of an extent to which output signals responsive to the image of the feature are produced from exactly one or from more than one of the adjacent array subelements, and to reach a conclusion from the data set as to a location of the image of the feature on the segmented array.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figures 1, 2:
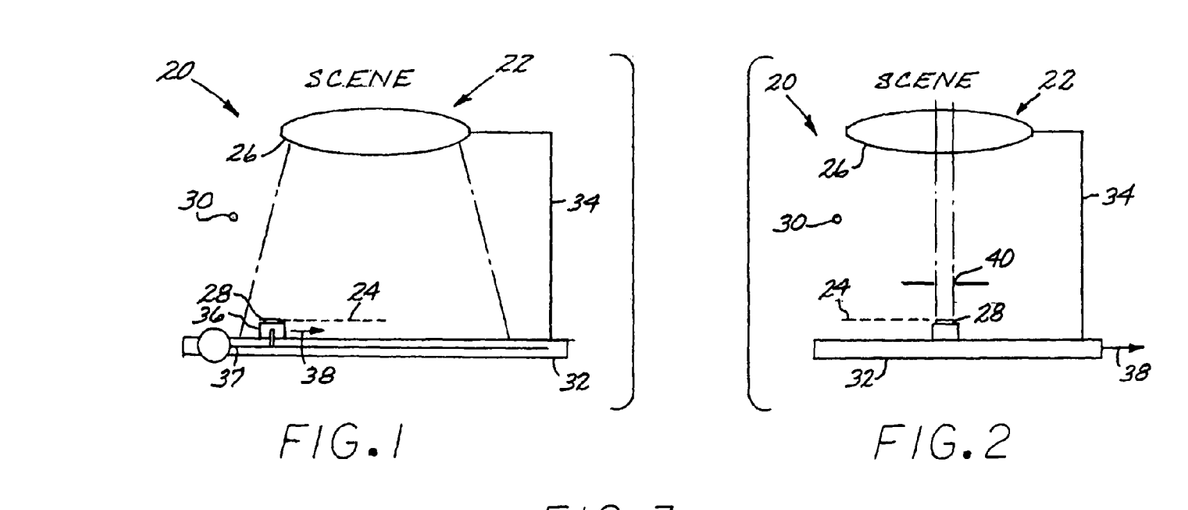
FIG. 1 is a schematic depiction of a first embodiment of an imaging sensor system using a one-dimensional detector array.
FIG. 2 is a schematic depiction of a second embodiment of the imaging sensor system using the one-dimensional detector array.

FIGS. 1-2 each depict an imaging sensor system 20 including an optics system 22 that images a feature of a scene at an image plane 24. The optics system 22 may be of any type, and may include lenses, mirrors, and or other optical components in any operable combination to address a specific imaging requirement. In the figures, the optics system 22 is schematically depicted as a single lens 26, but it is typically more complex than that. The scene feature is projected on the image plane 24 with some blurring, due to aberration and diffraction effects of the optical system. The blur of high-quality optical systems tends to be dominated by diffraction effects of the optical system, and the blur of low-cost systems by aberrations. In all cases, each point in the scene is imaged as a blur spot. The diameter of this spot is referred to as a "blur diameter", and is a characteristic of the optics system 22. Blur most often is discussed as a circular disk, even though it may in fact have a somewhat different shape due to specific details of the aberrations.

Figure 3:
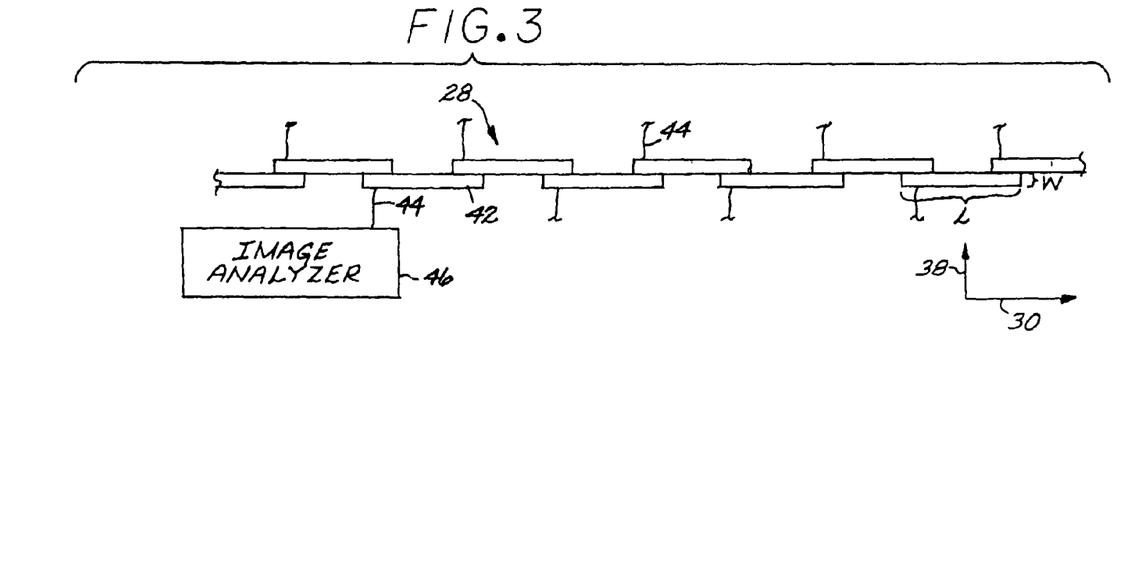
FIG. 3 is a plan view of the one-dimensional detector array according to the present approach.

The imaging sensor system 20 further includes a detector array 28, which is shown in greater detail in FIG. 3 (and other figures), located at the image plane 24. In the embodiments of FIGS. 1-2, the detector array 28 is a one-dimensional detector array that is elongated in a lengthwise direction 30 perpendicular to the plane of the illustration in FIGS. 1-2. The detector array 28 is supported on a platform 32, which also typically supports the optics system 22 through structure 34. The detector array 28 may be mounted on a movable support 36 driven by a scanning mechanism 37 that moves the detector array 28 relative to the platform 32 to provide a scanning movement in a scanning direction 38 that lies perpendicular to the lengthwise direction 30, as illustrated in FIG. 1. The scanning mechanism 37 may include, for example, a drive motor and slider structure that moves the movable support 36 and thence the detector array 28 in the scanning direction 38. Equivalently, the optics system 22 may include a scanning structure, such as a scan mirror, and scans the image in the scanning direction 38 past the detector array 28. The detector array 28 may instead be fixed to the platform 32 so that it is stationary relative to the platform 32, and the entire platform 32, with the supported detector array 28 and optical system 22, may be moved in the scanning direction 38 perpendicular to the lengthwise direction 30, as illustrated in FIG. 2. In this embodiment of FIG. 2, there is provided a slit aperture 40 or field stop, through which the image passes before reaching the detector array 28, although such an aperture or field stop is not essential. Any of these scanning movements allows the one-dimensional detector array 28 to sense the entirety of a two-dimensional image projected by the optics system 22.

Referring to FIG. 3, the one-dimensional detector array 28 is formed of a plurality of detector subelements 42. The detector subelements 42 detect the light energy of the image, and convert it to an electrical or other output signal 44. The output signals 44 are provided to an image analyzer 46.

Each of the detector subelements 42 is typically, but not necessarily, rectangular in shape when viewed in plan view as in FIG. 3. The detector subelements 42 are all typically, but not necessarily, of the same size. Each of the detector subelements 42 has a length L measured parallel to the lengthwise direction 30 and a width W measured parallel to the scanning direction 38. The length L is typically, but not necessarily, much larger than the width W.

The dimensions and relative positions of the detector subelements 42 are an important feature of the present approach. These quantities are described in terms of multiples of the blur diameter of the optics system 22 rather than in absolute dimensions. This approach accounts for the nature of the optics system 22, and effectively custom-tailors and "normalizes" the detector array 28 for the individual optics system 22 that is to be used.

Each of the detector subelements 42 has a width W of from about ½ to about 5 blur diameters, most preferably about 1 blur diameter, and a length L of n blur diameters. If the width W of the detector subelement 42 is less than about ½ blur diameter, energy of the image will be lost, and the signal-to-noise ratio is degraded because of loss of signal. If the width W is greater than about 5 blur diameters, too much background energy (i.e., noise) is detected by the detector subelements 42, and the signal-to-noise ratio of the detector array 28 is degraded because of increase in noise. In a usual case, the width W is about 1 blur diameter, which for many applications provides a good compromise between loss of signal and detected noise. The length L of the detector subelements 42 is left in general terms of "n", a quantity that will be subsequently related to other dimensions of the detector array 28.

Figure 4:
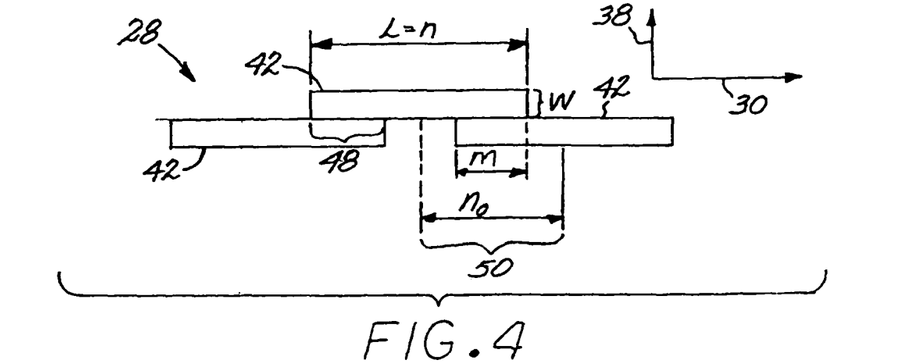
FIG. 4 is a detail of FIG. 3.

As shown in FIG. 3 and in more detail in FIG. 4, in the present approach each detector subelement 42 overlaps each of two adjacent detector subelements 42 along their lengths, i.e., measured parallel to the lengthwise direction 30. (The light energy from the scene is perpendicular to the plane of the illustration in FIGS. 3-4, so that the overlap does not obscure any portion of each detector subelement 42.) The spatial interrelation of the detector subelements 42 in this overlapping configuration is characterized by an overlap 48 (measured parallel to the lengthwise direction 30) of each of the two adjacent detector subelements 42 of m blur diameters, and a center-to-center spacing 50 of $n_O$ blur diameters (as measured parallel to the lengthwise direction 30) of each of the two adjacent detector subelements 42.

In this geometry, n is equal to about 3m and m is equal to about $n_O/2$. That is, the length L of each detector subelement 42 is about three times the overlap 48 of adjacent detector subelements 42, and the overlap 48 is about one-half of the center-to-center spacing 50 of adjacent detector subelements 42.

Preferably, n lies in a range of from about (3m−2) to about (3m+2), and m lies in a range of from about ($n_O/2$−1) to about ($n_O/2$+1).

Generally, where the length L of the detector subelements 42 is much larger than the blur diameter, n is equal to 3m and m is equal to $n_O/2$. For example, where the length L of the detector subelements is at least 20 times the detector width, n is substantially equal to 3m and m is substantially equal to $n_O/2$.

The geometrical values may range above and below those indicated for certain cases. For example, n may be substantially equal to (3m−2) and m may be substantially equal to ($n_O/2$−1), in a high-sensitivity, weak-signal situation wherein the length L of the detector subelements 42 is less than 20 times the detector width. At the other extreme, n may be substantially equal to (3m+2) and m may be substantially equal to ($n_O/2$+1), in a strong-signal situation wherein the length L of the detector subelements 42 is less than 20 times the detector width.

Figure 5:
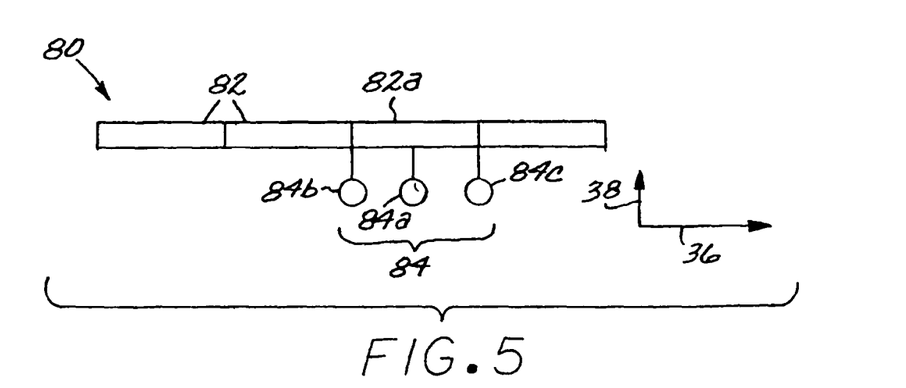
FIG. 5 is a plan view of a non-overlapping one-dimensional detector array.

FIG. 5 depicts in plan view a prior configuration of a one-dimensional detector array 80 in which the detector subelements 82 are abutted in an end-to-end fashion. Examples of blur-circle images 84 of a point source, each having a circular size of one blur diameter, are shown. (In most cases, there would be only a single blur-circle image 84 in a region, but multiple blur-circle images 84 are illustrated here to show the effect of the relation of the various blur-circle images 84 to the detector subelements 82.) The blur-circle images 84 are illustrated adjacent to the detector array 80 so that they do not obscure features of the detector subelements 82. Blur-circle image 84a lies lengthwise within an interior of one of the detector subelements 82. Blur-circle image 84a has an uncertainty of position that is nearly the entire length of the detector subelement 82. That is, the output signal of the detector subelement 82a in which the blur-circle image 84a resides will indicate the presence of the blur-circle image 84a within the detector subelement 82, but not the lengthwise location within the detector subelement 82. If the blur-circle image of the point source instead is at blur-circle images 84b or 84c and only partially lying within the detector subelement 82a (with the remainder of the image signal in an adjacent detector subelement), the output signal of the detector subelement 82a will be reduced, possibly to a level below a triggering level at which the image is recognized. Uncertainty about the presence and location of the blur-circle images 84b and 84c is the result.

Figure 6:
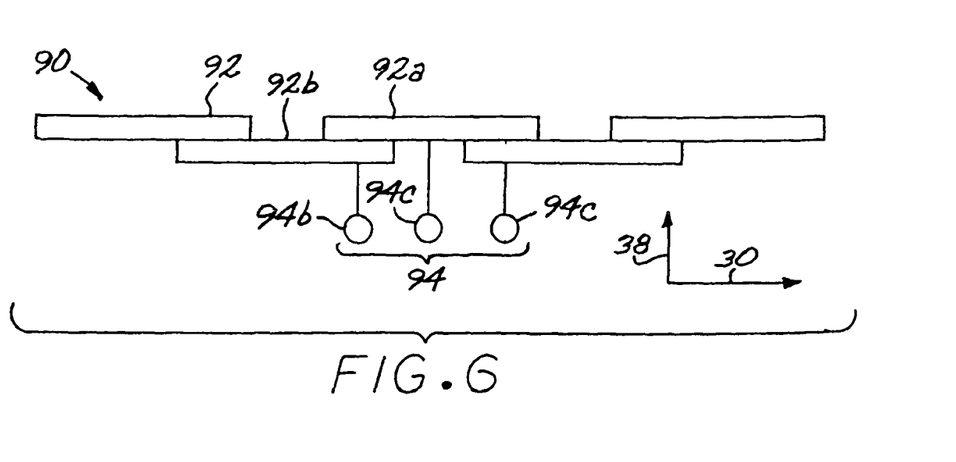
FIG. 6 is a plan view of one-dimensional detector array which is non-optimally overlapped.

FIG. 6 depicts in plan view a detector array 90 having a prior configuration in which there is a slight degree of lengthwise overlapping of the detector subelements 92. The uncertainty of the presence of the locating of the blur-circle images 94a and 94c is improved, because there will be no position of these blur-circle images that never lies wholly within one of the detector subelements 92. For example, as the detector array 92 scans in the scanning direction 38, the blur-circle image 94a will at some point lie wholly within detector subelement 92a or 92b.

Figure 7:
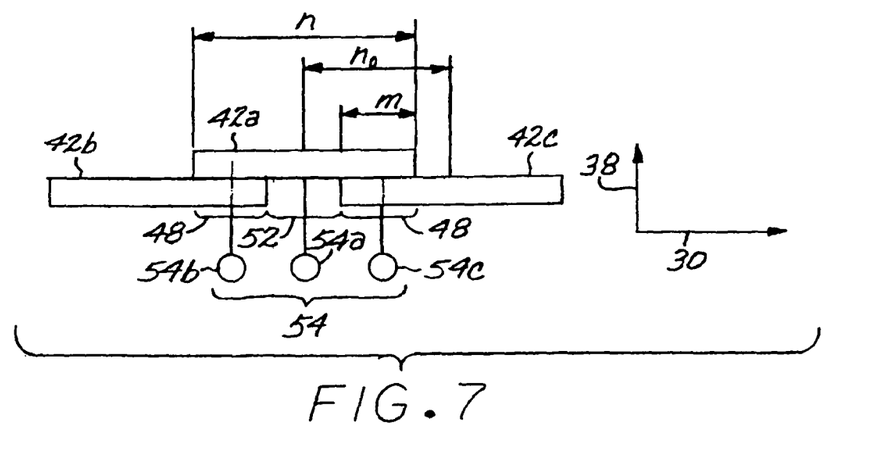
FIG. 7 is a plan view of the one-dimensional detector array that is optimally overlapped for a long-detector-subelement condition.

FIG. 7 depicts in plan view the present detector array 28 with detector subelements 42 lengthwise overlapped according to the present approach. Where n is equal to about 3m and m is equal to about $n_O/2$, as illustrated for the configuration where the detector subelement length L is at least about 20 times the detector subelement width W, the length of each nonoverlapped region 52 is about the same as the length of each overlap 48. The position of a blur-circle image 54 may be readily determined by observing whether, as the detector array 28 scans in the scanning direction 38, the blur-circle image is detected in only one or in two detector subelements 42. For example, in the depiction of FIG. 7, if the blur-circle image 54a is detected only by detector subelement 42a and not by either of detector subelements 42b or 42c, then the blur-circle image 54a must be in the nonoverlapped region 52. If the blur-circle image 54b is detected both by detector subelement 42a and by detector subelement 42b as the detector array 28 scans, then the blur-circle image 54b must be in the overlapped region 48 between detector subelements 42a and 42b. If the blur-circle image 54c is detected both by detector subelement 42a and by detector subelement 42c as the detector array 28 scans, then the blur-circle image 54c must be in the overlapped region 48 between detector subelements 42a and 42c. No blur-circle image 54a, 54b, or 54c will ever be detected by at least one detector subelement 42a, 42b, or 42c with less than its full signal strength. The exact locational of the blur-circle image 54a, 54b, and 54c is optimally determined, with about twice the accuracy of the nonoverlapped configuration of FIG. 5 for the same total field of regard.

For those cases where the length L of the detector subelements 42 is not significantly longer than its width W, for example where L is less than about 20 times W, end effects of images lying near the ends of detector subelements 42 become more significant. In those cases, it remains the case that n is equal to about 3m and m is equal to about $n_o/2$, but there are preferably small systematic variations from the condition where n is equal to exactly 3m and m is equal to exactly $n_o/2$.

Figure 8:
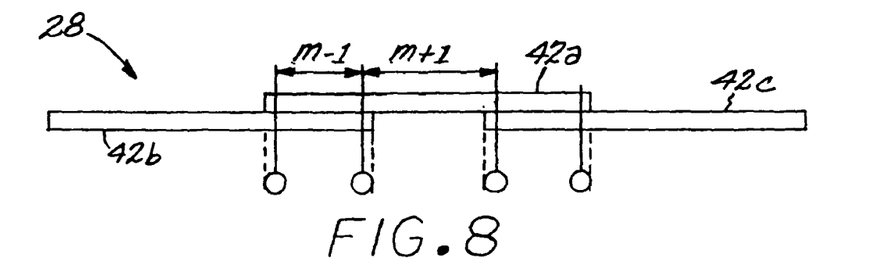
FIG. 8 is a plan view of the one-dimensional detector array that is optimally overlapped for a short-detector-subelement, weak signal condition.
Figure 9:
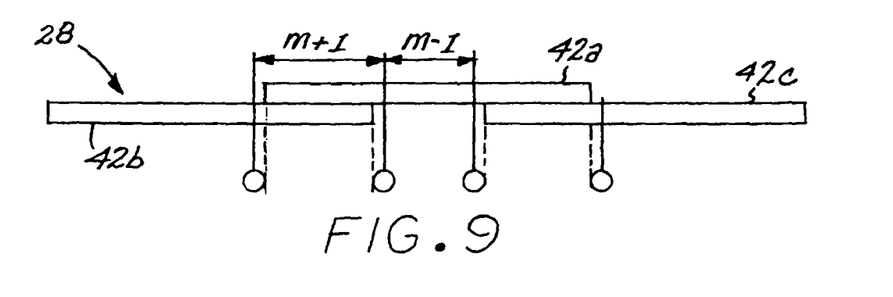
FIG. 9 is a plan view of the one-dimensional detector array that is optimally overlapped for a short-detector-subelement, strong signal condition.
Figure 15:
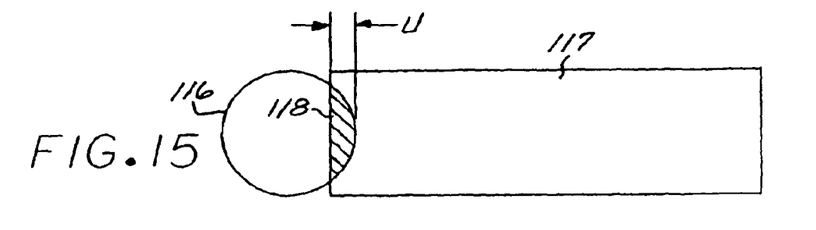
FIG. 15 is a schematic depiction of the geometry of the captured energy for incomplete interception by the detector subelement.
Figure 16:
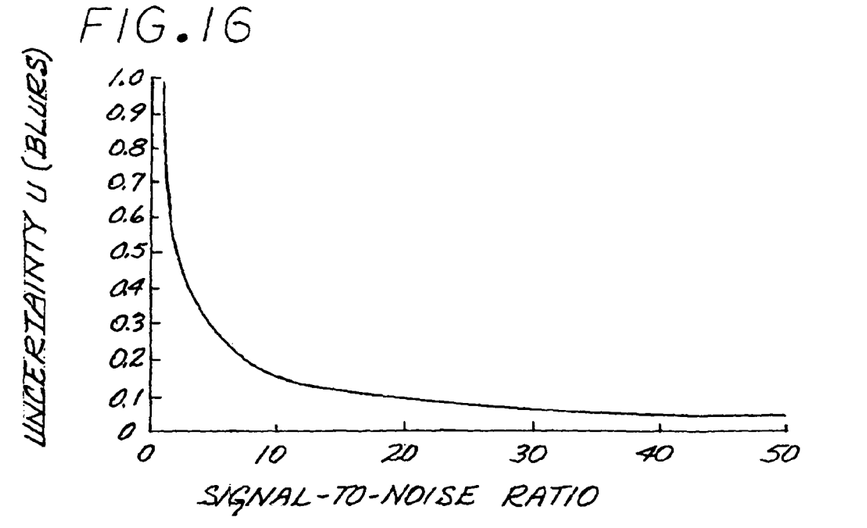
FIG. 16 is a graph of the relation of the uncertainty U as a function of the signal-to-noise ratio.

The nature of the variations depends upon whether the signal strength is relatively weak, as in FIG. 8 (i.e., low signal-to-noise ratio), or relatively strong, as in FIG. 9 (i.e., high signal-to-noise ratio). The signal-to-noise ratio is related to the positional uncertainty as follows. For example, FIG. 15 shows the relationship between signal strength and ambiguity in blur circles, for an idealized circular disk blur circle. In this model of the blur circle 116, the signal strength is constant throughout the blur circle 116 and zero outside of the blur circle 116. When the blur circle 116 partially overlaps a detector subelement 117, the captured energy 118 is related to the linear uncertainty in position U. The relation between the uncertainty U and the signal-to-noise ratio is indicated in FIG. 16. For the present purposes, a high signal-to-noise ratio is 20 or more, and a low signal-to-noise ratio is less than 20. Thus, for example, an uncertainty of no more than 0.1 blurs leads to a high signal-to-noise ratio of 20 or greater.

For a relatively weak signal, unless the blur-circle image is entirely intercepted by a detector subelement, it is not detected. This causes an equivalent shortening of the detector array, inasmuch as locations within n/2 of the end points are not detected. Consequently, there is an asymmetry in the accuracy and resolution, in which the center region is extended and the overlap region is reduced, as illustrated in FIG. 8. In this case, as may be deduced from FIG. 8, n is substantially equal to (3m−2) and m is substantially equal to ($n_o/2-1$). Even if the geometry of the detector array is optimized for the weak-signal case, optimum performance may still be obtained for stronger signals by properly analyzing the output signal data.

For relatively strong signals, the blur-circle image detected when only modestly intercepted by a detector element at its ends, and the opposite symmetry results, as illustrated in FIG. 9. In this case, as may be deduced from FIG. 9, n is substantially equal to (3 m+2) and m is substantially equal to ($n_o/2+1$). Because the relatively weak signal case of FIG. 8 may be utilized for both relatively weak and relatively strong signals, it is preferred to use that configuration for those applications where the detector length L is relatively short compared to the detector width W. That is, L is still greater in magnitude than W, but not as much greater as for the case illustrated in FIG. 7.

The approach discussed above in relation to FIGS. 1-9 deals with overlapped one-dimensional arrays of detector elements, which are typically scanned to produce a two-dimensional image. The present invention is also applicable to staring two-dimensional arrays in which scanning is not needed to produce a two-dimensional image, and is discussed in relation to FIGS. 10-14.

Figure 10:
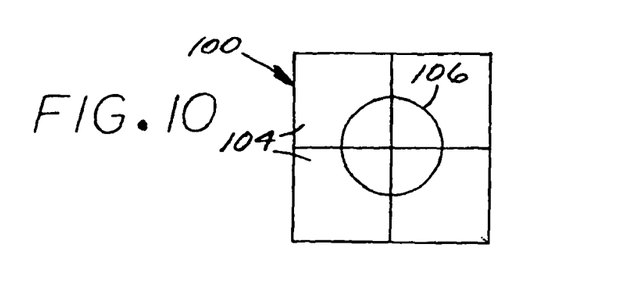
FIG. 10 is a plan view of a two-dimensional square detector array that is not in accordance with the invention.
Figure 11:
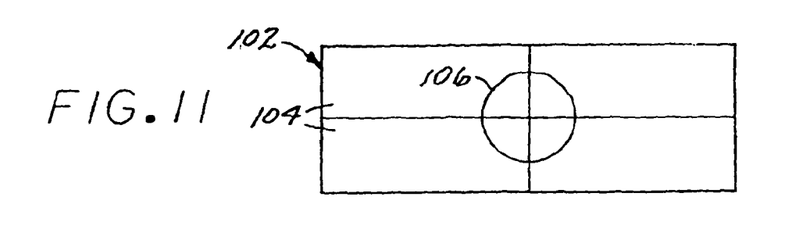
FIG. 11 is a plan view of a two-dimensional rectangular detector array that is not in accordance with the invention.

FIGS. 10-11 respectively illustrate a prior two-dimensional square array 100 (FIG. 10) and a prior two-dimensional rectangular array 102 (FIG. 11) where there is no staggering of the individual detector subelements 104, which is typical. In the worst case for each of these arrays 100 and 102 and as illustrated, the energy of a blur-circle image 106 is equally divided among four detector subelements 104. Each of the detector subelements 104 receives only 25 percent of the energy of the blur-circle image 106.

Figure 12:
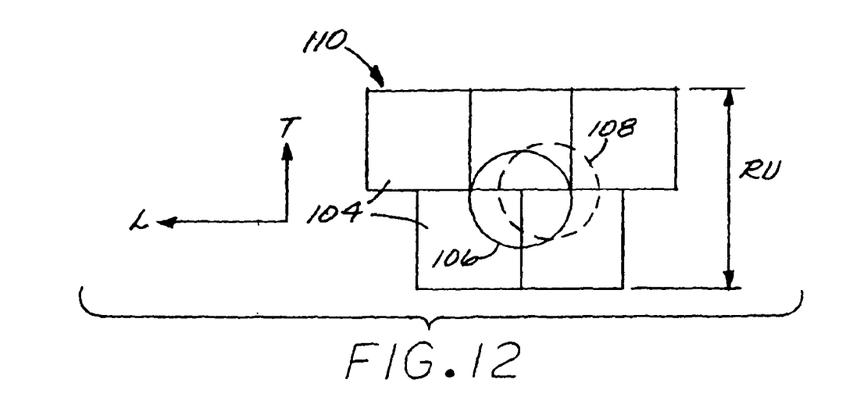
FIG. 12 is a plan view of a first embodiment of a two-dimensional detector array according to the present approach, using a square detector element.
Figure 13:
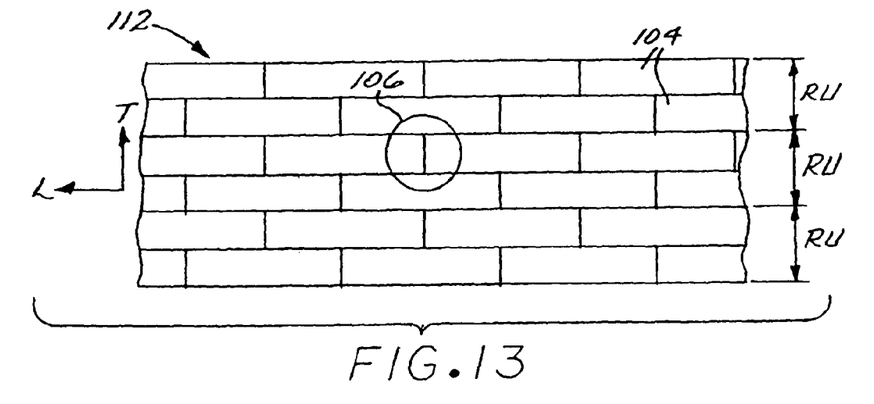
FIG. 13 is a plan view of a second embodiment of a two-dimensional detector array according to the present approach, using a rectangular detector element.
Figure 14:
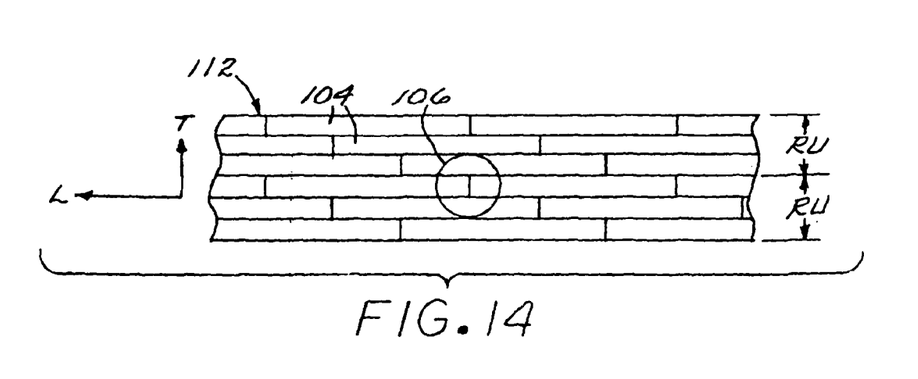
FIG. 14 is a plan view of a third embodiment of a two-dimensional detector array according to the present approach, using a rectangular detector element.

FIGS. 12-14 respectively illustrate a present two-dimensional staggered square array 110 wherein the square detector subelements 104 have a length of 1 blur diameter and a height of 1/1 or 1 blur diameter (FIG. 12), a two-dimensional rectangular array 112 wherein the rectangular detector subelements 104 have a length of 2 blur diameters and a height of ½ blur diameter (FIG. 13), and a two-dimensional rectangular array 114 wherein the rectangular detector subelements 104 have a length of 3 blur diameters and a height of ⅓ blur diameter (FIG. 14). A worst-case location of the blur circle 106 is illustrated in each case, where "worst-case" refers to the placement of the blur circle that produces the smallest image intensity on any of the detector subelements 104 that is overlaid by the blur circle (comparable to the placement of the blur circles in FIGS. 10-11). In each figure, transverse T and longitudinal L directions are indicated. If the structures are characterized as a series of rows extending parallel to the longitudinal direction L, repeating units RU that may be used to build up the entire structure by repetition in the transverse T direction are indicated.

In FIG. 12, a blur-circle image 108 is illustrated in which the blur-circle 108 intersects four detector subelements 104, but not in four equal areas. One of the detector subelements 104 has a significantly higher image intensity than does any of the other detector subelements 104.

In the present square array of FIG. 12, the smallest image intensity is 33⅓ percent of the total image intensity of the blur circle 106. That is a (33⅓-25)/25 or 33⅓ percent improvement over either of the prior cases illustrated in FIGS. 10-11. In the present rectangular array of FIG. 13, the smallest image intensity is 30.4 percent of the total image intensity of the blur circle 106. That is a (30.4-25)/25 or 22 percent improvement over either of the cases illustrated in FIGS. 10-11. In the rectangular array of FIG. 14, the smallest image intensity is 29.2 percent of the total image intensity of the blur circle 106. That is a (29.2-25)/25 or 17 percent improvement over either of the cases illustrated in FIGS. 10-11.

Sensitivity performance of the present two-dimensional detector array is improved by ensuring that the detector subelements 104 are sized and staggered such that an area of the blur-circle image 106 may not simultaneously be split equally among four detector subelements 104. Optimal sensitivity performance may be achieved by making each detector element m (where m is a positive integer) blur diameters long parallel to the longitudinal direction L and by staggering the detector subelements 104 in adjacent rows with a lengthwise overlap of 1 blur diameter relative to a laterally adjacent detector subelement 104. The result is a staggered pattern of detector subelements 104 that repeats every m laterally adjacent rows (i.e., the length RU).

Figure 17:
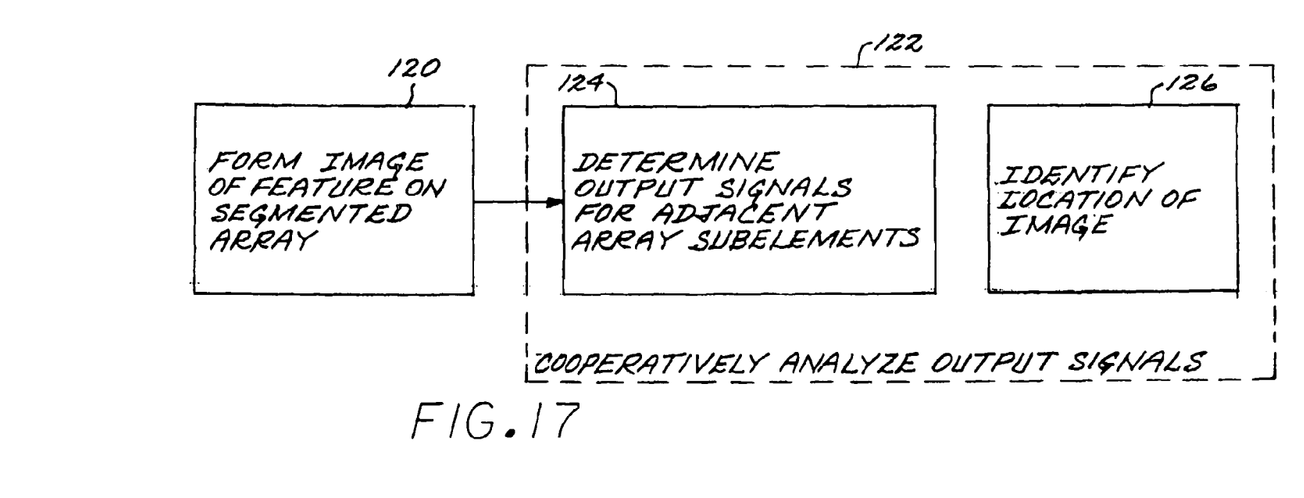
FIG. 17 is a block flow diagram of a method for practicing an embodiment of the invention.

FIG. 17 depicts a method for locating a position of a feature in a scene. An image of the feature is formed, step 120, using a segmented array having a plurality of array subelements. Preferably but not necessarily, a sensor system 20 such as that described above is used to form the image in step 120. The output signals from at least two spatially adjacent array subelements are cooperatively analyzed, step 122. The purpose of the cooperative analysis 122 is to establish a data set reflective of an extent to which output signals responsive to the image of the feature are produced from exactly one or from more than one of the adjacent array subelements, and to reach a conclusion from the data set as to a location of the image of the feature on the segmented array 30. To implement step 122, the output signals 34 for adjacent detector subelements 42 are first determined, step 124, and then the location of the image is identified, step 126.

Figure 18:
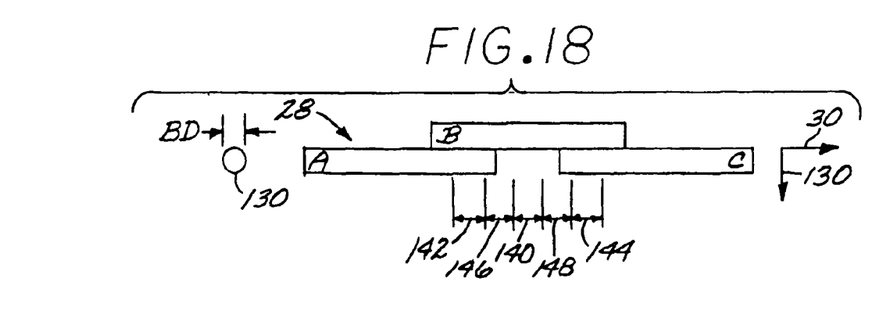
FIG. 18 is a schematic plan view of an overlapped one-dimensional segmented array of light-detector subelements similar to FIG. 3, with indicated ranges relevant to the present analytical approach.

FIG. 18 illustrate how these steps 124 and 126 are performed to achieve the cooperative analysis for the detector array corresponding to FIG. 7. Other cases are analyzed in a comparable manner. If the imaged feature 26 is a point, its image is projected as the blur circle 130 at the image plane 24 due to diffraction and aberration effects of the optics system 22. The diameter of the blur-circle image at the image plane 24 of the point at infinity is termed the "blur diameter" BD, which is a characteristic of the optics system 22.

In the illustrated configuration of FIG. 18, there is a ⅓ longitudinal overlap in each pair of the light-detector subelements AB and BC. If there is a full-strength output signal from light-detector subelement B only as the segmented light-detector array 28 is scanned in a transverse direction 132 perpendicular to the lengthwise direction 30 of the detector array 28, the image must be within the range 140. If there is a full-strength output signal from both light-detector subelements A and B, the image must be within the range 142. If there is a full-strength output signal from both light-detector subelements B and C, the image must be within the range 144. Further information on the location of the image may be gained by considering fractional output signals. Thus, for example, if a partial-strength output signal is obtained from light-detector subelement A and a full-strength output signal is obtained from light-detector subelement B, the image must be within the range 146. If a partial-strength output signal is obtained from light-detector subelement C and a full-strength output signal is obtained from light-detector subelement B, the image must be within the range 148. By configuring the overlapping light-detector subelements D, E, and F so that the ranges 140, 142, 144, 146, and 148 are the same lengths (as illustrated in FIG. 18), the position of the image may be determined with the greatest accuracy.

Yet further accuracy of the image location may be achieved by evaluating proportional output signals in the approach of FIG. 18, as to the ranges where the image falls within two of the light-detector subelements. For example, if there is a 75 percent output from light-detector subelement A and a 25 percent output from light-detector subelement B, the image must lie within the range 146 but more within light-detector subelement A than light-detector subelement B. The distinction is that in the embodiment of the analysis approach of the present invention discussed in preceding paragraphs, the determination is whether output signals responsive to the image of the feature are produced in single ones or combinations of the intersecting array subelements. In the embodiment of the analysis approach of the present invention discussed in this paragraph, the determination is the relative strengths of the output signals responsive to the image of the feature that are produced in combinations of the intersecting array subelements.

The present discussion has assumed that the blur circle 60 has a constant intensity across its area, which is typically a reasonably good assumption. If that assumption is not met and the blur circle 60 as a position-dependent intensity, this variation in intensity may be taken into account in the computer implementation of the analytical approach discussed herein.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An imaging sensor system comprising
an optics system that images a point feature of a scene at an image plane as a blur-circle image having a blur diameter; and
a detector array at the image plane,
wherein the detector array is a one-dimensional detector array comprising a plurality of detector subelements each having a width of from about ½ to about 5 blur diameters, and a length of n blur diameters,
wherein each detector subelement overlaps each of two adjacent detector subelements along their lengths,
wherein an overlap of each of the two adjacent detector subelements is m blur diameters and a center-to-center spacing of each of the two adjacent detector subelements is $n_O$ blur diameters, and
wherein n is equal to about 3m and m is equal to about $n_O/2$.

2. The imaging sensor system of claim 1, wherein the detector subelements each have a width of about 1 blur diameter.

3. The imaging sensor system of claim 1, wherein n lies in a range of from about (3m−2) to about (3 m+2), and m lies in a range of from about ($n_O/2−1$) to about ($n_O/2+1$).

4. The imaging sensor system of claim 1, wherein n lies in a range from (3m−2) to (3m+2), and m lies in a range of from ($n_O/2−1$) to ($n_O/2+1$).

5. The imaging sensor system of claim 1, wherein n is equal to 3m and m is equal to $n_O/2$.

6. The imaging sensor system of claim 1, wherein the length of the detector subelements is at least 20 times the detector width, and wherein n is substantially equal to 3m and m is substantially equal to $n_O/2$.

7. The imaging sensor system of claim 1, wherein n is substantially equal to (3m−2) and in is substantially equal to ($n_O/2−1$).

8. The imaging sensor system of claim 1, wherein the length of the detector subelements is less than 20 times the detector width, and wherein n is substantially equal to (3m−2) and m is substantially equal to ($n_O/2−1$).

9. The imaging sensor system of claim 1, wherein n is substantially equal to (3 m+2) and m is substantially equal to ($n_O/2+1$).

10. The imaging sensor system of claim 1, wherein the length of the detector subelements is less than 20 times the detector width, and wherein n is substantially equal to (3 m+2) and m is substantially equal to ($n_O/2+1$).

11. The imaging sensor system of claim 1, further including a scanning mechanism that scans the one-dimensional detector array in a scanning direction perpendicular to the length of the detector subelements.

12. The imaging sensor system of claim 1, further including a moving platform upon which the one-dimensional detector array is mounted.

13. An imaging sensor system comprising
an optics system that images a point feature of a scene at an image plane as a blur-circle image having a blur diameter; and a detector array at the image plane,
  wherein the detector array is a two-dimensional detector array comprising a plurality of detector subelements, and wherein each detector subelement is rectangular in plan view with a length of n blur diameters, a lengthwise overlap of 1 blur diameter relative to a laterally adjacent detector subelement, and a staggered pattern of detector subelements that repeats every in laterally adjacent rows, where m is a positive integer, and
  wherein the detector subelements are sized responsive to the blur diameter.

14. A method for locating a position of a feature in a scene, comprising the steps of forming an image of the feature using a segmented array having a plurality of array subelements, wherein each of the array subelements has an output signal, and wherein the step of forming an image includes the step of providing a one-dimensional segmented array having spatially overlapping array subelements; and cooperatively analyzing the output signals from at least two spatially adjacent array subelements to establish a data set reflective of an extent to which ouput signals responsive to the image of the feature are produced from exactly one or from more than one of the adjacent array subelements, and to reach a conclusion from the data set as to a location of the image of the feature on the segmented array.

* * * * *